United States Patent
Frasco

(10) Patent No.: US 7,891,980 B2
(45) Date of Patent: Feb. 22, 2011

(54) INTERCONNECT DEVICE WITH DISCRETE IN-LINE COMPONENTS

(75) Inventor: Gary D. Frasco, Whitehouse Station, NJ (US)

(73) Assignee: Dialogic Corporation, Montreal, Quebec (CA)

( * ) Notice: Subject to any disclaimer, the term of this patent is extended or adjusted under 35 U.S.C. 154(b) by 247 days.

(21) Appl. No.: 12/265,311

(22) Filed: Nov. 5, 2008

(65) Prior Publication Data

US 2010/0112826 A1  May 6, 2010

(51) Int. Cl.
*H01R 12/00* (2006.01)

(52) U.S. Cl. ........................................... 439/65

(58) Field of Classification Search ............... 439/65, 439/66, 82, 83, 943, 499, 67, 70
See application file for complete search history.

(56) References Cited

U.S. PATENT DOCUMENTS

| | | | |
|---|---|---|---|
| 5,538,433 A * | 7/1996 | Arisaka | 439/70 |
| 5,865,642 A * | 2/1999 | Rugg | 439/499 |
| 6,362,525 B1 | 3/2002 | Rahim | |
| 6,518,517 B2 | 2/2003 | Baechtle et al. | |
| 6,657,136 B1 | 12/2003 | Liao et al. | |
| 6,705,006 B2 | 3/2004 | Baechtle et al. | |
| 6,809,268 B2 | 10/2004 | Hayashi et al. | |
| 7,233,061 B1 | 6/2007 | Conn | |
| 7,286,366 B2 | 10/2007 | Zollo et al. | |
| 7,350,296 B2 | 4/2008 | Ryu et al. | |
| 7,442,046 B2 | 10/2008 | Simonsson et al. | |
| 7,672,140 B2 * | 3/2010 | Lane | 361/760 |
| 2002/0033409 A1 | 3/2002 | Cilia et al. | |
| 2002/0100611 A1 | 8/2002 | Crockett et al. | |
| 2004/0118676 A1 | 6/2004 | Mizohata et al. | |
| 2004/0130032 A1 | 7/2004 | Gronbeck et al. | |
| 2006/0193118 A1 | 8/2006 | Ahmad et al. | |
| 2008/0072422 A1 | 3/2008 | Levante et al. | |
| 2008/0251906 A1 | 10/2008 | Eaton et al. | |
| 2009/0175012 A1 | 7/2009 | Frasco | |

FOREIGN PATENT DOCUMENTS

WO  WO 03/049512  6/2003

OTHER PUBLICATIONS

C-Press "True" Compliant Press-Fit Connectors, Winchester Electronics, © 2008.
BGA Application Guide. Tyco Electronics. 2004.
Winchester Electronics—C-Press Technology, 2007.

* cited by examiner

*Primary Examiner*—Edwin A. Leon
(74) *Attorney, Agent, or Firm*—Weingarten, Schurgin, Gagnebin & Lebovici LLP

(57) ABSTRACT

An interconnect device is provided with a body through which a plurality of wells has been defined. At least one component having two terminals is provided in one or more of the wells. The component is sealed in its respective well such that the two terminals are accessible on opposite sides of the body. The body corresponds to a Ball Grid Array (BGA) device and is positioned between a BGA device and a printed circuit board (PCB). The component in the well is then inline with a solder ball on the BGA device and a corresponding pad on the PCB. Providing the component in the well frees up surface area on the PCB and also allows for positioning the component closer to a source of a signal. A component in the well is a discrete component having two terminals that may be solderable or made from a conductive pliable material. The terminals may be spring-mounted on the component.

25 Claims, 12 Drawing Sheets

INTERCONNECT DEVICE WITH DISCRETE IN-LINE COMPONENTS

FIELD OF THE INVENTION

The present invention relates generally to sockets for devices and printed circuit boards and, more particularly, to discrete components provided in a socket.

BACKGROUND OF THE INVENTION

The ever increasing complexity of today's electronic devices has led to more complex circuits being provided in smaller packages. Faster system clock speeds increase the chances of spurious and interfering emissions signals being created as well as raise issues with respect to impedance matching between device pins and connections. Signal lines are, at times, terminated with appropriate devices such as resistors or capacitors in order to match impedance and other passive components are provided in order to reduce transients and spurious signal transmissions. It is often desirable to locate the terminating or impedance matching device as close as possible to the signal source or load.

Surface mount (SMT) passive components, such as resistors, capacitors and inductors, are commonly provided on printed circuit boards (PCBs) to address these issues. Referring to FIG. 1, there is illustrated one example of a standard SMT resistor 1100. The resistor 1100 has a generally rectangular package body 1102 with two solderable pads 1104 for connecting to a printed circuit board. Surface mount passive components are generally fairly small—with a longitudinal length, L, of about 0.040 inches (±0.002 inches), a height, h, of about 0.018 inches (±0.002 inches), and a width, w, of about 0.020 inches (±0.002 inches). Despite the already small size of these components, the drive toward ever smaller electronic devices, e.g., cell phones and cameras, and thus, smaller and more densely populated printed circuit boards, makes placement of even passive SMT components on printed circuit boards challenging.

The Ball Grid Array (BGA) device presents issues when a terminating device, e.g., a resistor, needs to be connected and placed nearby. Referring now to FIG. 2, a BGA device 1110 has an underside surface 1112 with an array of solder balls 1114. The solder balls 1114 serve as contacts to an integrated circuit (IC) within the package. The array of solder balls 1114 is configured to attach, either mechanically by compression or when soldered, to a printed circuit board 1106 with a corresponding array of pads 1108 as conductive contacts on a surface 1109.

Referring to FIG. 3, there is illustrated an example of a BGA device 1110 with solder balls 1114 coupled to respective pads 1108 on the PCB 1106. As is known, the solder balls 1114 of the BGA device 1110 may be coupled to the pads 1108 of the PCB 1106 by soldering or by compression fit with the implementation of any one of a number of known mechanisms. The coupling is both mechanical and electrical in that an electrical signal from the IC within the BGA device 1110 will pass through a solder ball 1114 to its respective pad 1108 on the PCB 1106 and on to whatever other device or devices is connected to that pad 1108.

Generally, there is a very limited space or area in which to place a passive component, such as a resistor, whereby it is both on the PCB 1106 and physically close to a solder ball 1114 of a BGA device 1110, or its corresponding pad 1108. This is especially challenging for a solder ball 1114 or pad 1108 not at the outer portions of the array. This limited space creates a challenge for optimal component placement. As is known, with multi-layer printed circuit boards, vias are used to connect surface mount components to signal traces on other board layers as well as to the solder balls 1114 of the BGA device 1110. For example, referring back to FIG. 2, there is illustrated an example of a printed circuit board 1106 with pads 1108, vias 2112a and 2112b, and traces 2110a and 2110b, used to connect the surface mount resistor 1100 to the BGA device 1110. The trace 2110b, however, forms an extra stub length that can add undesirable inductance, thus possibly affecting performance or causing spurious noise, but which is required to connect the surface mount resistor 1100 to the BGA device 1110.

As shown in FIG. 4, a vertical stub is caused by a via 2112 connecting a surface mount resistor 1100 to inner signal layers of a multi-layer board. The surface mount resistor 1100 is mounted on either (the top or bottom, i.e., an outer surface, of a multi-layer printed circuit board and connected (by its solderable terminals 1104) to a signal trace 2110. The via 2112 is used to connect the surface mount resistor 1100 to signal traces 2116 on other layers. In the illustrated example, a via pad 2114 couples the via 2112 to a signal trace 2116a on layer two, thereby forming a series connection of the trace 2110, resistor 1100, and trace 2116a. The remaining length of the via 2112 from layer three to the bottom via pad 2118 on layer six is an extra vertical stub length that adds additional inductance and could act as an antenna.

Buried passive components are an alternative to surface mount passive components. A buried passive component, for example, a resistor, is screened onto an inner layer of the printed circuit board and is connected to traces and vias as needed. The buried component may be placed on an inner layer, possibly eliminating a via that would otherwise be needed to connect the component from the top or bottom of the board to a signal trace on an inner layer. Vias are still needed, however, to form connections between the signal traces on different layers. Thus, the presence of the buried component on the signal layer still requires valuable via and signal trace space on the inner layers of the board.

What is needed is a mechanism for providing passive components on a PCB that uses BGA devices as close as possible to a BGA contact without having to give up a large amount of PCB surface area to vias and signal traces.

SUMMARY OF THE INVENTION

An interconnect device is provided with a body through which one or more wells have been provided. A two-terminal component is positioned in one or more of the wells. The component is sealed in its respective well such that the two terminals are accessible on opposite sides of the body. The body corresponds to a Ball Grid Array (BGA) device and each well corresponds with a solder ball of the BGA device and a pad on a printed circuit board (PCB). The body is positioned between the BGA device and PCB. The component in the well is then inline with the solder ball on the BGA device and the corresponding pad on the PCB. Providing the component in the well frees up surface area on the PCB and also allows for positioning the two-terminal component closer to a signal source from the BGA device. The terminals of the component may be solderable or made from a conductive pliable material and may be spring-mounted on the component.

BRIEF DESCRIPTION OF THE DRAWINGS

Various aspects of at least one embodiment of the present invention are discussed below with reference to the accompanying figures. In the figures, which are not intended to be drawn to scale, each identical or nearly identical component that is illustrated in various figures is represented by a like numeral. For purposes of clarity, not every component may be labeled in every drawing. The figures are provided for the purposes of illustration and explanation and are not intended as a definition of the limits of the invention. In the figures.

DETAILED DESCRIPTION

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. In particular, acts, elements and features discussed in connection with any one or more embodiments are not intended to be excluded from a similar role in any other embodiments. Also, the phraseology and terminology used herein is for the purpose of description and should not be regarded as limiting. The use herein of "including," "comprising," "having," "containing," "involving," and variations thereof, is meant to encompass the items listed thereafter and equivalents thereof as well as additional items.

It has been found that for several types of electronic devices, for example, some telecommunications devices, there is a need to terminate signal traces on the printed circuit board (PCB) with a resistor in order to match impedance of a signal source, e.g., a driver pin on an IC, to the PCB transmission line. Due to component spacing constraints and limited space on the PCB for placing resistors, however, adding even one resistor to a printed circuit board design becomes difficult. Buried resistors may use up too much valuable horizontal surface area and via space, and the use of conventional surface mount resistors may degrade electrical performance of the device due to extra stub lengths created by the vias, as discussed above.

Figure 5:
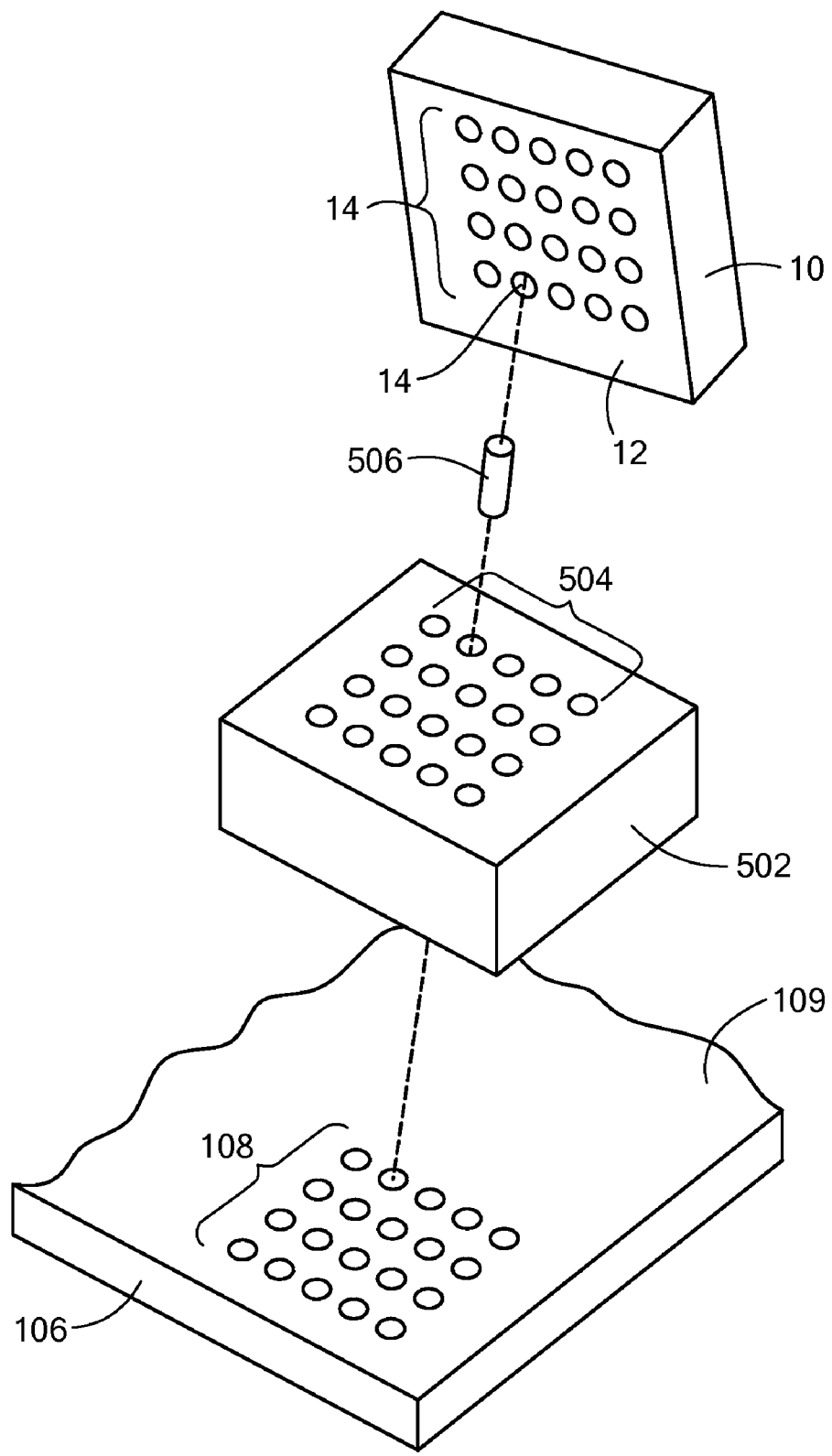
FIG. 5 is an exploded view of one embodiment of the present invention.

To address these and other problems with conventional passive components, embodiments of the present invention are directed, generally, to an interconnect device in the form of a socket to be interposed between a Ball Grid Array (BGA) device and a PCB. Referring now to FIG. 5, an interconnect device in the form of socket 502 includes an array of wells 504 configured in a same arrangement as solder balls 14 on an underside surface 12 of a BGA device 10. A well 504 may include a discrete device 506 in the respective well. Accordingly, the discrete device 506 is electrically in series with the solder ball 14 and a corresponding pad 108 on a surface 109 of a printed circuit board 106. The various embodiments of the present invention are described in more detail herein; however, the representation in FIG. 5 is provided as an overview with some details, discussed herein below, not shown in order to improve clarity of the figure.

Figure 6:
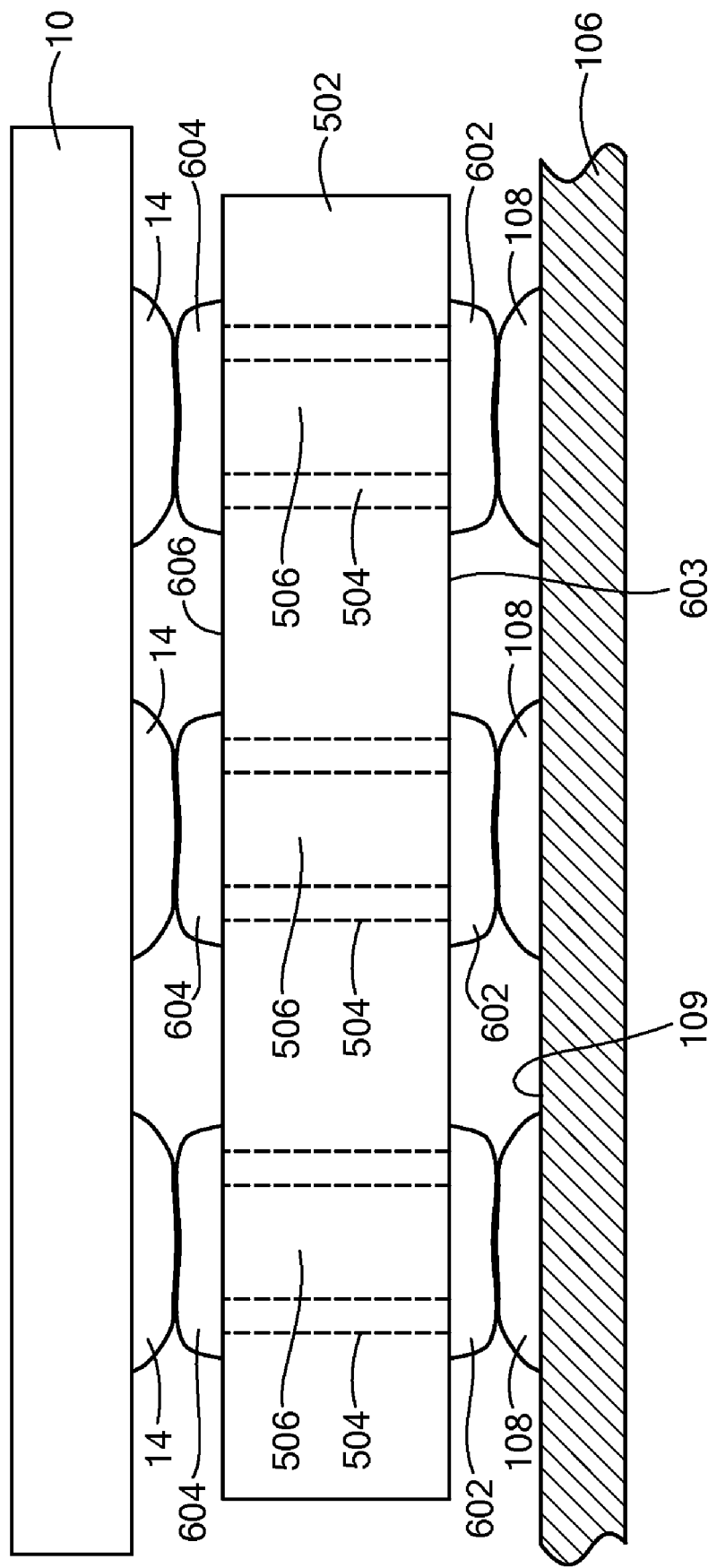
FIG. 6 is a side view of discrete devices disposed within wells of a socket after assembly in accordance with the present invention.
Figure 7:
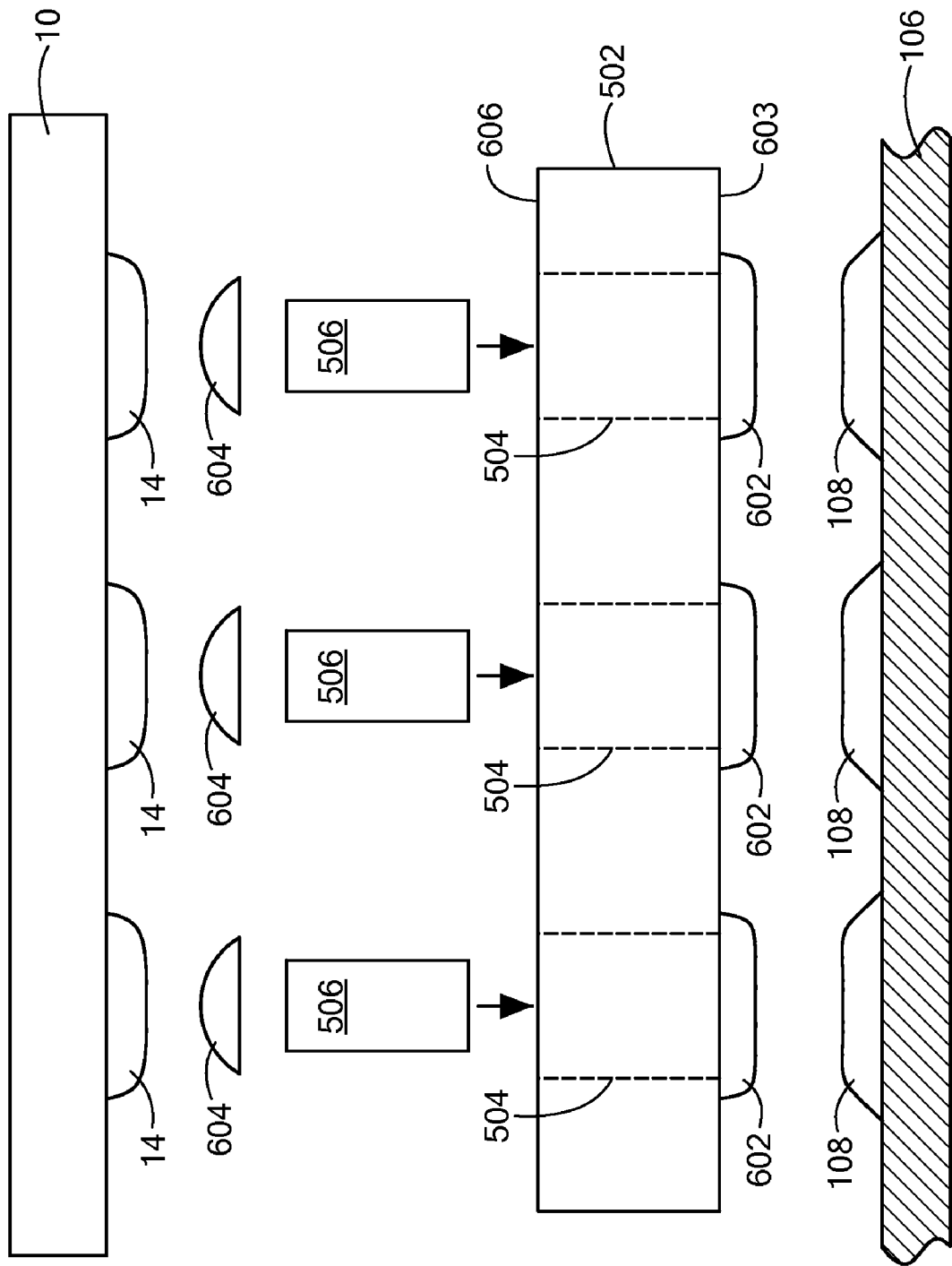
FIG. 7 is an exploded view of the embodiment of the present invention presented in FIG. 6.

A well 504 may include a respective discrete device 506, e.g., a resistor, as shown in FIG. 6. The well 504 extends through the socket 502 with a well lower pad 602 on a well lower surface 603 at one end and a well upper pad 604 on a well upper surface 606 at another end. The well lower pad 602 is electrically coupled to a first end of the discrete device 506 and the well upper pad 604 is electrically coupled to the other end of the discrete device 506. The well lower pad 602 of a respective well 504 is coupled with a respective pad 108 in the array on the printed circuit board 106. At the other end of the well 504, the well upper pad 604 is coupled to a respective solder ball 14 of the BGA device 10. An exploded view of the assembly shown in FIG. 6 is presented in FIG. 7. Details of construction of the socket 502, the well upper pad 604 and the well lower pad 602 will be discussed in detail below. It should be noted that reference to "upper" and "lower" are labels merely for aiding in explanation and are not meant to limit orientation of the socket to any specific direction.

Figure 1:
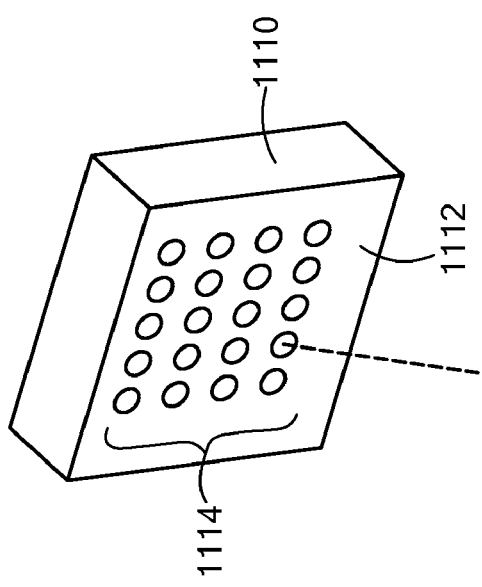
FIG. 1 is a diagram of one example of a conventional surface mount resistor.
Figure 2:
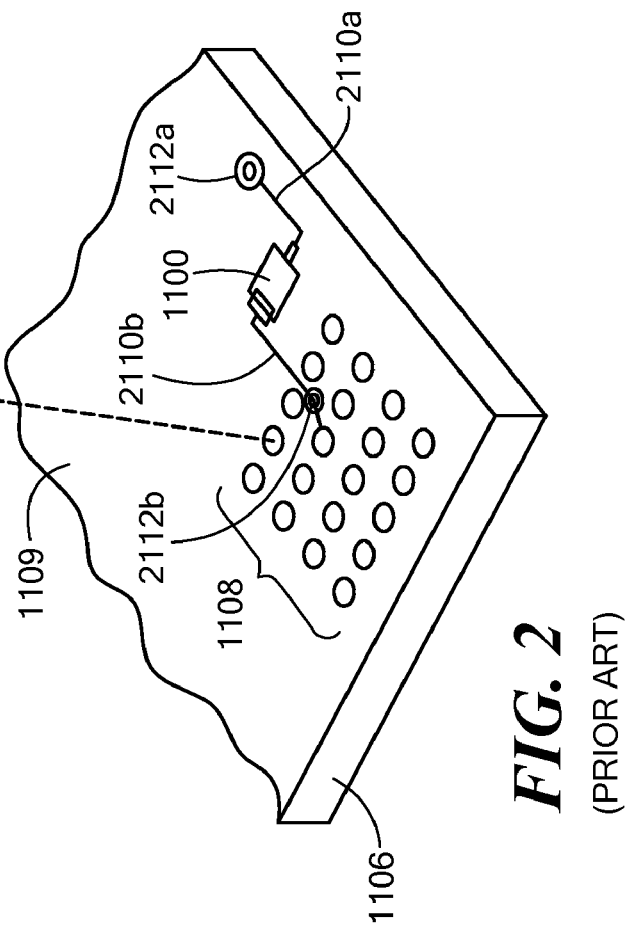
FIG. 2 is a diagram of a conventional ball grid array (BGA) device including the surface mount resistor of FIG. 1 mounted on a PCB.
Figure 3:
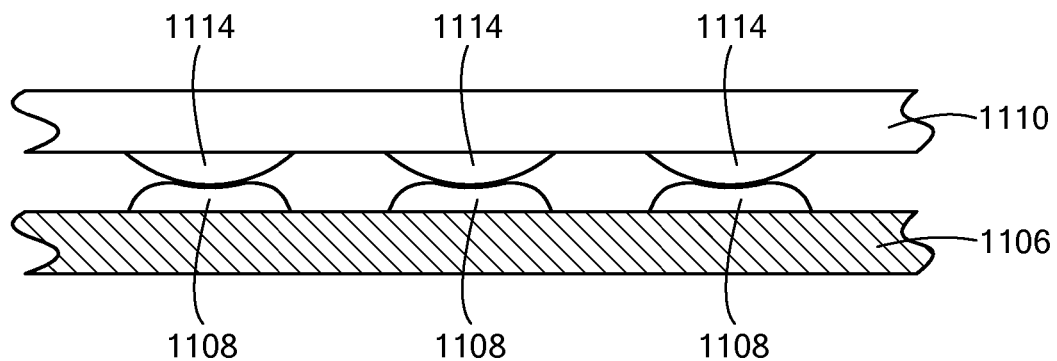
FIG. 3 is a side-view diagram of a conventional BGA device mounted on a PCB.
Figure 4:
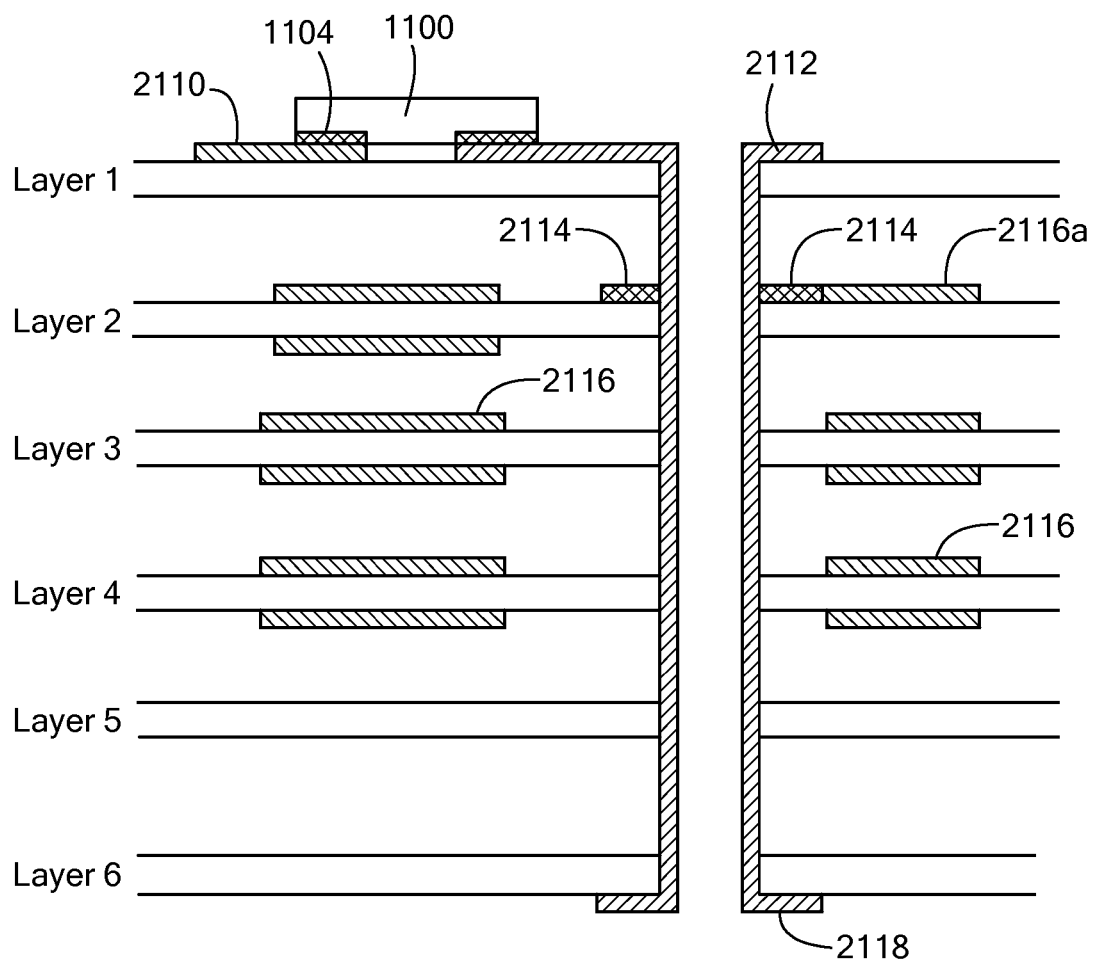
FIG. 4 is a vertical cross-sectional view of one example of a conventional multi-layer printed circuit board including the surface mount resistor of FIG. 1.

The discrete device 506 may be a resistor, capacitor, diode, or an inductor, i.e., any two-terminal device. Further, the discrete device 506 may contain a plurality of devices combined into one housing having first and second end contacts. In one embodiment of the present invention, a standard surface mount device (such as described above with reference to FIG. 1) may be provided in the well 504.

Figure 8:
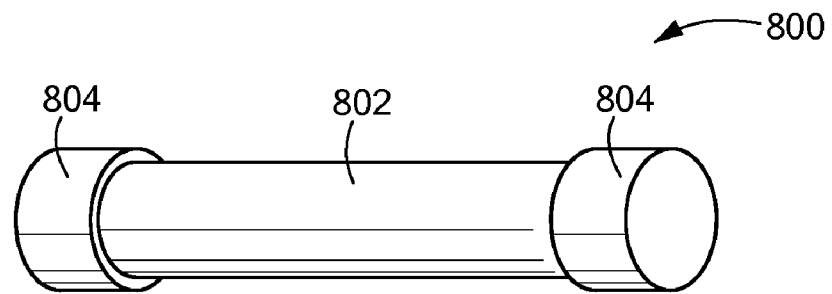
FIGS. 8 and 9 are representations of a Spring-Loaded Discrete Component in accordance with one embodiment of the present invention.

In one embodiment of the present invention, a Spring Loaded Discrete Component (SLDC) 800, as shown in FIG. 8, is provided. The SLDC 800 comprises a substantially cylindrical body portion 802 having conductive terminals 804 disposed at first and second ends, respectively. The conductive terminals 804 are spring-loaded onto the respective ends of the body portion 802 so as to move within a predetermined distance longitudinally with respect to the body portion 802.

Figure 9:
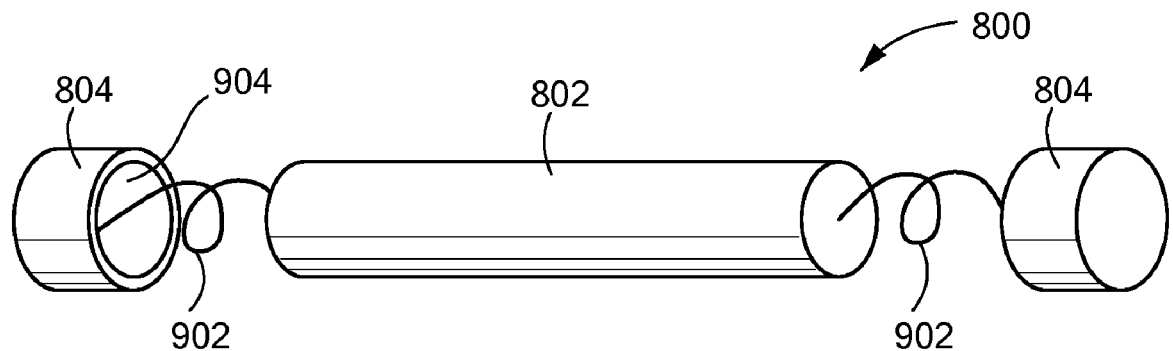

As shown in FIG. 9, an exploded view of the SLDC 800 shown in FIG. 8, conductive springs 902 couple, i.e., attach or affix, a respective end of the body portion 802 to a respective terminal 804. The body portion 802 comprises a material chosen to configure the SLDC device 800 as either a resistor, an inductor, diode, a fuse, a battery, or a capacitor, i.e., a conventional two-terminal device. The first and second conductive terminals 804 are made of a conductive material as known to those of ordinary skill in the art. Further, at least one of the terminals 804 is configured with a "cup" shape or a recess 904, such that the body portion 802 may be moved into the recess 904 in opposition to the urging of the spring 902.

Figure 10:
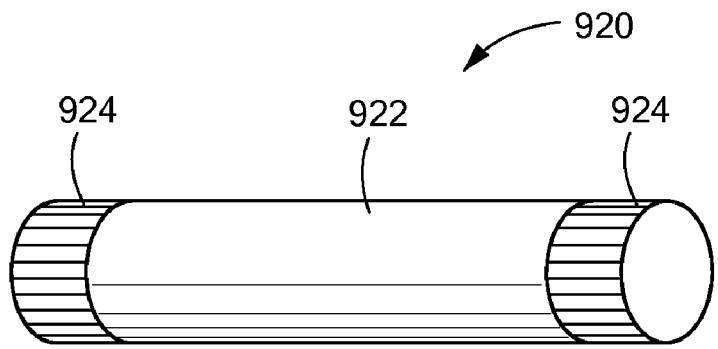
FIG. 10 is a representation of a Conductive End Cap Component in accordance with one embodiment of the present invention.

In another embodiment of the present invention, a Conductive End Cap Component (CECC) device 920 is provided. As shown in FIG. 10, the CECC device 920 includes a body portion 922 having a substantially cylindrical shape with a pliable conductive end cap 924 at each end. Each end cap 924 may be made from any pliable and yet conductive material such as a conductive polymer. The end caps 924 may be affixed, i.e., attached or coupled, to the body portion 922 by a conductive glue or epoxy or by a mechanical fastening of one to the other. The body portion 922 comprises material chosen to configure the CECC device 920 as, for example, one of: a resistor, a capacitor, an inductor, a fuse, a battery, or a diode, i.e., a two-terminal device.

Figure 11:
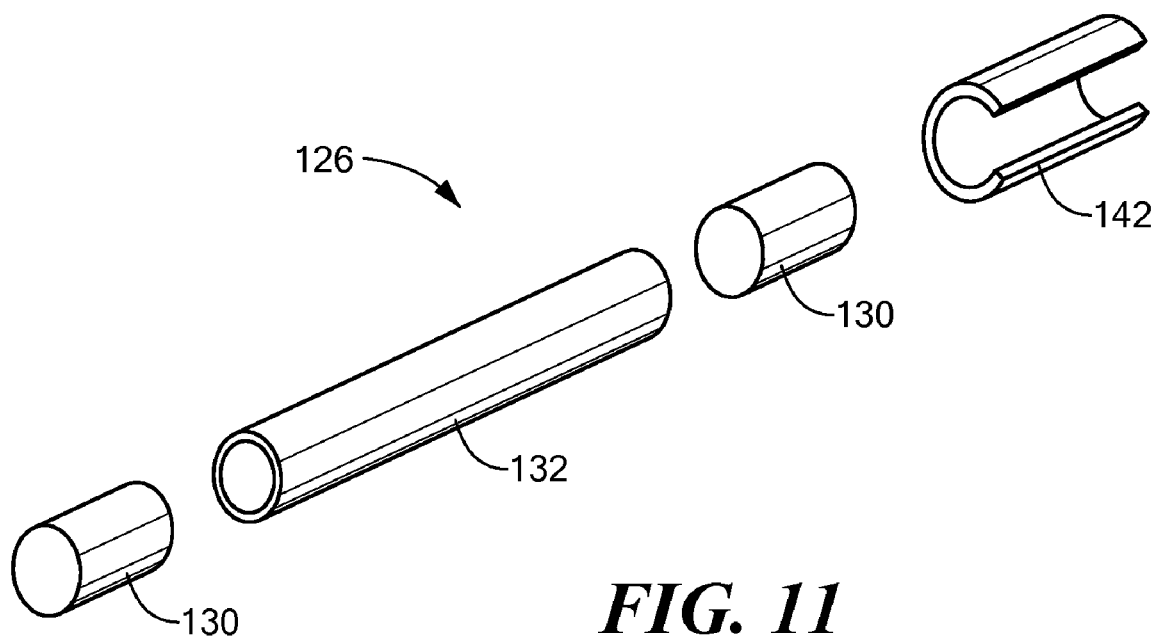
FIG. 11 is an exploded view of a press fit passive component.

Referring to FIG. 11, there is illustrated an exploded view of another embodiment of the discrete device 506, namely a press-fit passive component 126 as described in pending U.S. application Ser. No. 11/969,401 filed Jan. 4, 2008, entitled "Press Fit Passive Component" which is incorporated by reference herein, in its entirety, and for all purposes. The press-fit passive component 126 includes a cylindrical body 132 and two solderable terminals 130, one disposed at each end of the body 132. In the illustrated example, the body 132 is cylindrical in shape, however, embodiments of the press fit passive component 126 are not limited to being cylindrical in shape.

Figure 12:
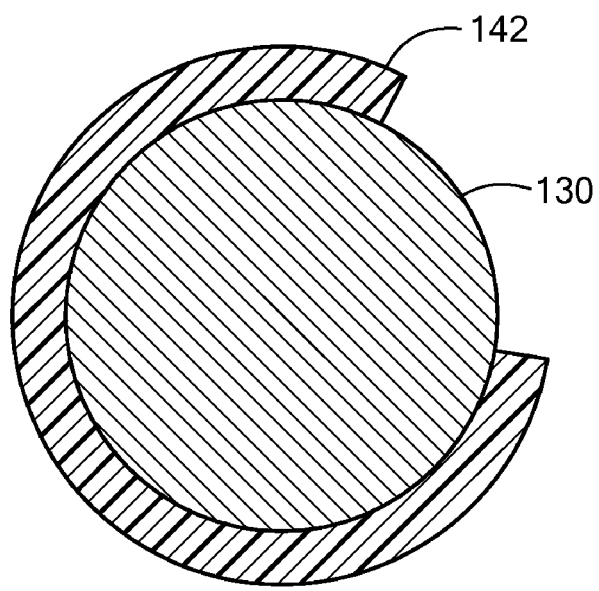
FIG. 12 is a radial cross-sectional diagram of one example of a press fit passive component according to aspects of the invention.

A non-conductive collar 142 is disposed about a portion of the body 132 as shown in FIG. 12. In one example, the collar 142 comprises a dielectric material. The dielectric material may comprise a pliable material that may be deformed under pressure, such as, for example, an elastic rubber, a polymeric material (a thermoset or thermoplastic polymer) or foamed polymeric material. By way of non-limiting example, the pliable material can be polytetrafluoroethylene. According to one embodiment, the collar 142 may be made of a material that provides minimal insertion force, adequate stability, can withstand high temperatures, and is still pliable enough to close to a complete ring upon insertion.

In addition, in some instances it may be advantageous to have the dielectric collar 142 made of a material that is dissolvable, e.g., using certain solvents, so as to allow easy removal of the press fit passive component 126. In one embodiment, the dielectric collar 142 may be placed around an approximate center of the body 132. However, it is to be appreciated that other placements of the dielectric collar 142 are also possible.

Figure 13:
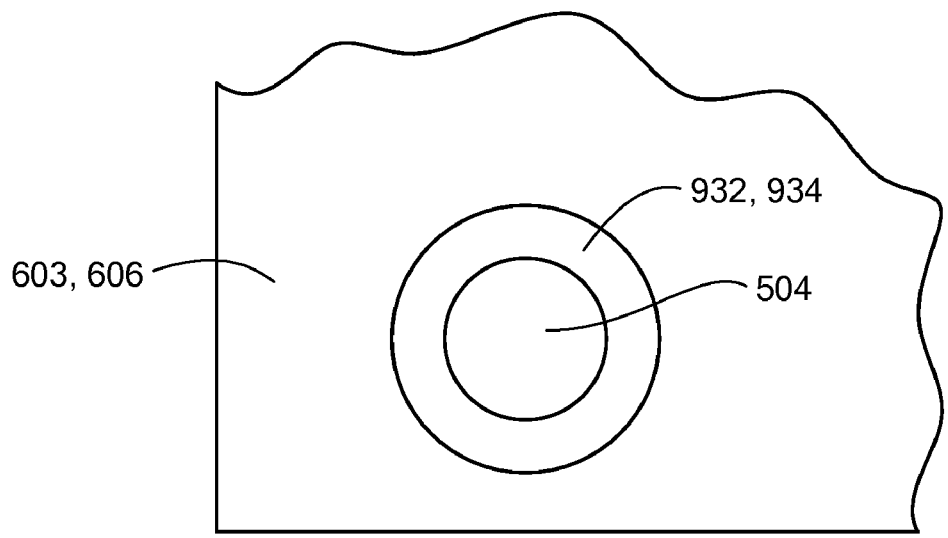
FIG. 13 is a top view of a surface of a socket in accordance with one embodiment of the present invention.

In one embodiment of the present invention, the socket 502 is provided with a solder pad at each opening of each of the wells. Referring now to FIG. 13, which depicts an end view of one well 504, an upper solder pad 932 is provided on the upper surface 606 about one opening of the well 504. A lower solder pad 934 is provided on the lower surface 603 and, as shown, each end of the well 504 would look the same as the other end.

Figure 14:
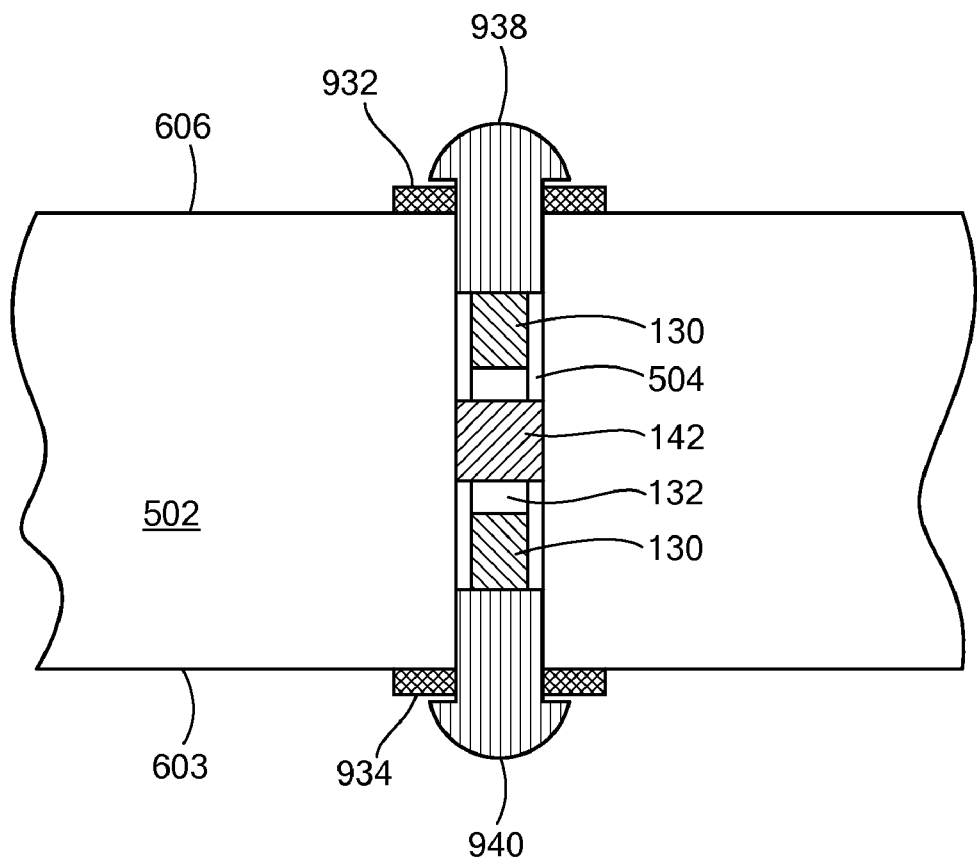
FIG. 14 is a vertical cross sectional view of a socket having a press fit passive component located within a well.

Referring to FIG. 14, there is illustrated, in cross-section, a portion of the socket 502 including a press fit passive component 126 inserted within a well 504, in accordance with one embodiment of the present invention. The well 504 extends through the socket 502 and is coupled to respective solder pads 932, 934 on the socket surface and disposed about the well openings. Solder 938, 940 may be used to provide electrical connection to the press fit passive component 126 by connecting to the solder pad 932, 934 and respective terminal 130. For example, solder 938, 940 may connect the respective solderable terminal 130 of the press fit passive component 126 to respective solder pad 932, 934, which may, in turn, couple the BGA device 10 to the PCB 106.

According to one embodiment of the present invention, solder 938, 940 may be deposited over the well 504 and pads 932, 934, such that the solder contacts the solderable terminals 130 of the press fit passive component 126, and standard heat processes (such as those used to solder surface mount components to a printed circuit board) may be used to melt the solder and bond the press fit passive component 126 to the pads 932, 934 to create the well upper and lower pads described above.

As discussed above, the press fit passive component 126 includes a dielectric collar 142 disposed about at least a portion of the body 132. The dielectric collar 142 may serve to secure the press fit passive component 126 within the well 504, particularly prior to soldering. In one embodiment, the dielectric collar 142 may comprise a C-ring, as illustrated in FIG. 12. When the press fit passive component 126 is inserted into the well 504, the C-ring may be compressed to form a gas tight seal around the press fit passive component 126. The dielectric collar 142 may thus isolate one solderable terminal 130 from the other and prevent solder 938, 940 from leaking through the well 504 and "shorting out" the press fit passive component 126.

Figure 15:
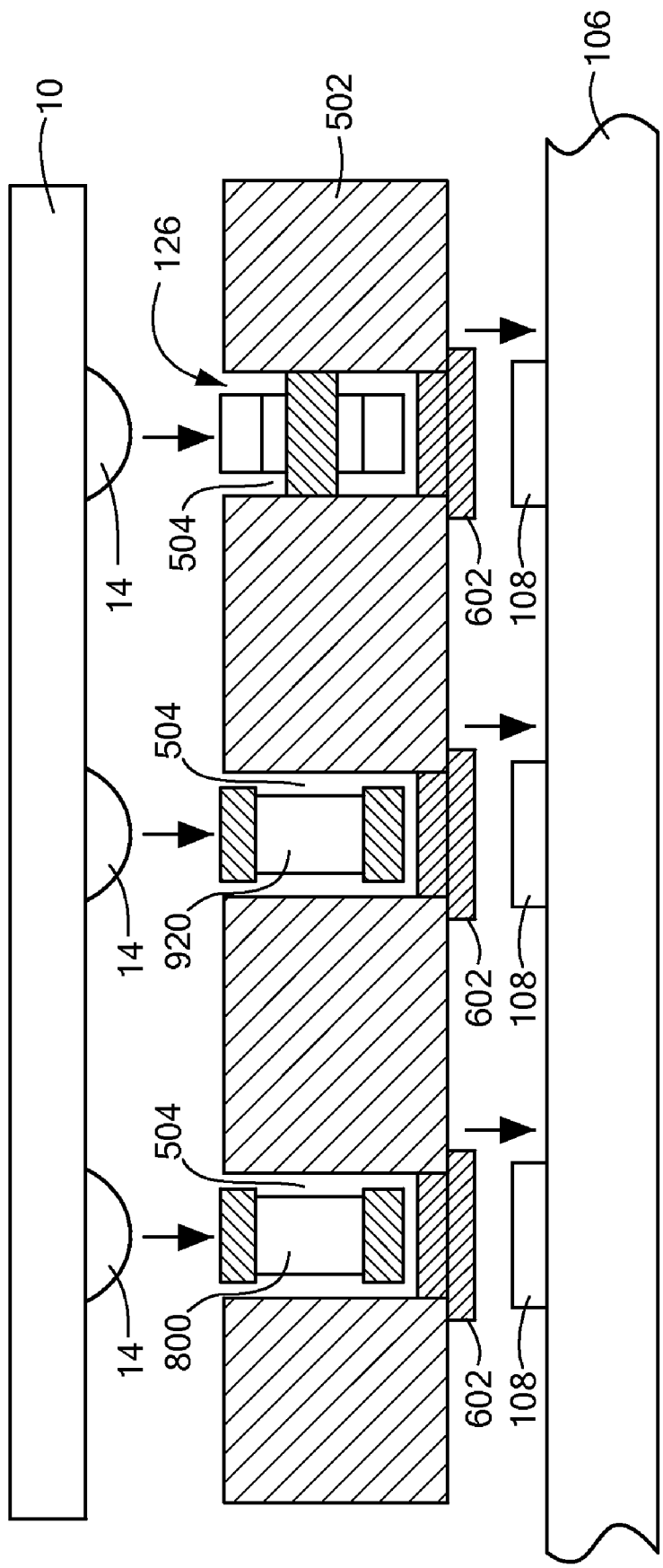
FIG. 15 is a representation of a system according to embodiments of the present invention.

Referring now to FIG. 15, a socket 502 is provided with wells 504, in which one well includes an SLDC device 800, another well includes a CECC device 922, and a third well includes a press fit passive component 126. The BGA device 10 is then oriented with the wells 504 of the socket 502 such that the solder balls 14 of the BGA device 10 make contact with the respective device. Advantageously, the spring function of the SLDC device 800 and the compliance characteristics of the CECC device 920 accommodate any difference in depth with respect to the solder ball 14 and the well 504. The BGA device 10 can be removed easily to replace either the SLDC or CECC device. As described above, the press fit passive component 126 may be soldered into the socket 502, although not shown in FIG. 15.

Figure 16:
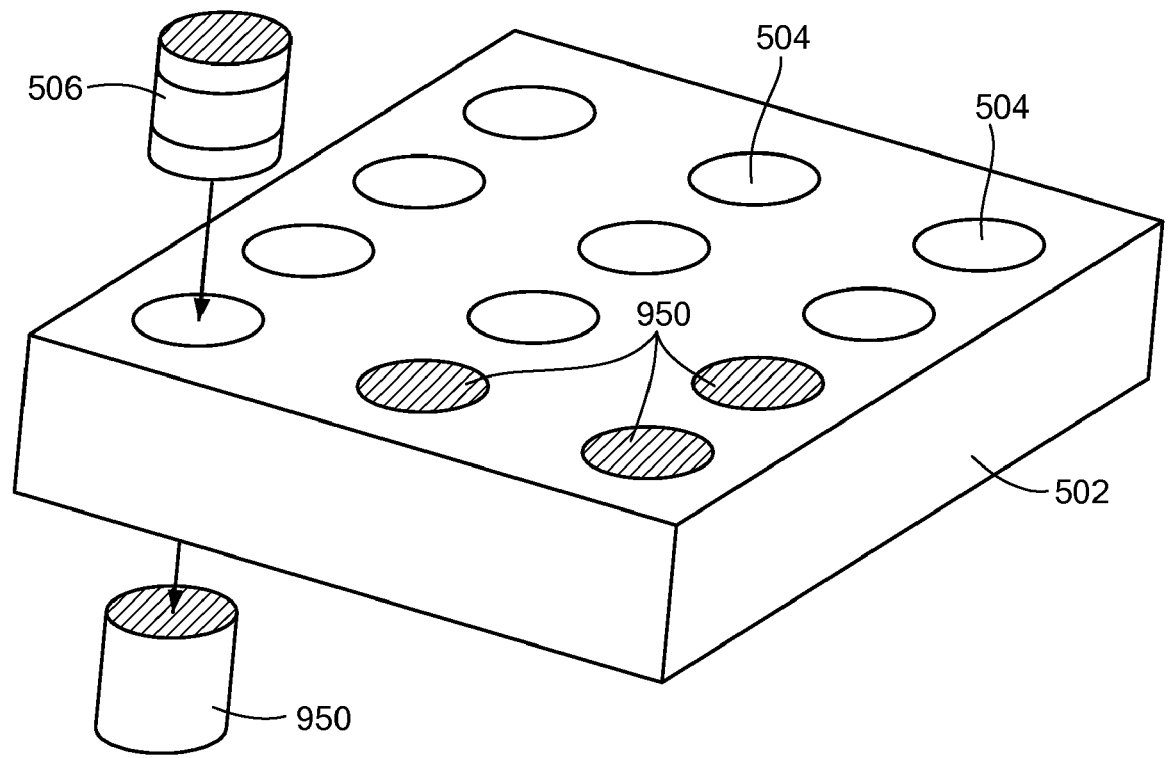
FIG. 16 is an exploded view of a connection system with the use of dummy resistors according to one embodiment of the present invention.

For many BGA devices 10, it may be unnecessary to interpose a discrete device between every solder ball 14 and its respective pad 108. Thus, in one embodiment of the present invention, as shown in FIG. 16, a socket 502 is initially provided with a dummy, or zero Ohm, resistor 950 in one or more wells 504. In one embodiment, a dummy resistor is placed in each well and discrete devices 506, in accordance with any of the embodiments described above, can be "pushed through" to displace one or more dummy resistors 950. Subsequently, connections to any pads that may be necessary, as described herein, can be made and the socket 502 configured accordingly. In an alternate embodiment, a conductive spring can be provided as the dummy resistor. Advantageously, a spring can accommodate any depth differences and maintain sufficient electrical connection.

Figure 17:
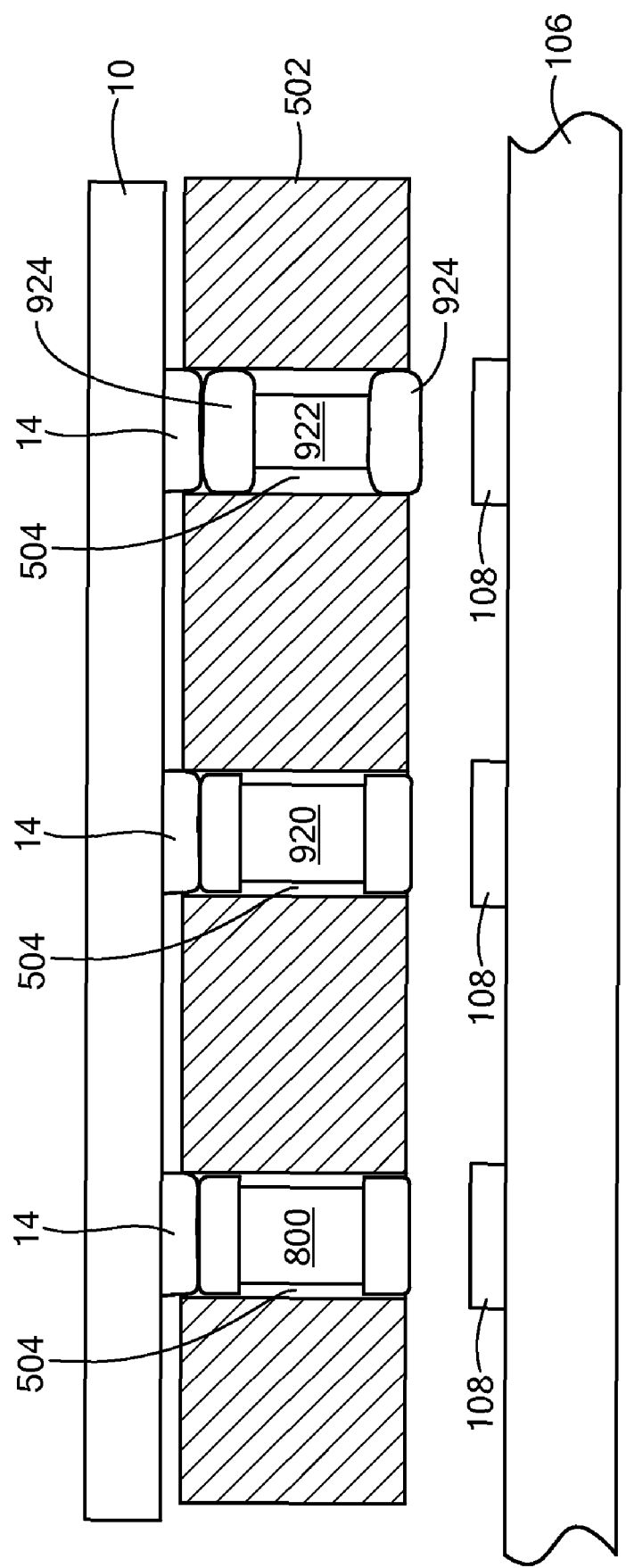
FIG. 17 is a representation of a socket in accordance with an embodiment of the present invention.

While the foregoing embodiments have set forth the use of unitary discrete components, in an alternate embodiment as shown in FIG. 17, a well 504 of the socket 502 may be provided with separated components. For example, as an alternative to a CECC device 920 of unitary construction as shown in FIG. 10, the individual parts, i.e., the body portion 922 and the end caps 924, could be loaded into a well 504.

Thus, as shown, a first pliable conductive end cap 924 could be placed in the well 504 followed by a separate body portion 922 and another pliable conductive end cap 924. These three components would then be pressed together by operation of the BGA device 10 on top of the socket 502 placed over the array of pads 108 on the printed circuit board 106. Similarly, the separate components of the SLDC 800 may be provided in a well 504. Further, a hybrid implementation is possible where, for example, a first pliable end cap 924 is loaded in, followed by a press-fit device 126.

The socket and component system according to various embodiments of the present invention presented above may provide several advantages to printed circuit board designers and manufacturers. For example, a printed circuit board designer may no longer need to add extra vias and traces to connect a surface mount component to a device. By placing the discrete devices "inline" in a socket, vias and traces are not necessary and the discrete device can be placed closer to the source of the signal.

An embodiment of the present invention, as described above, implemented the socket with respect to a Ball Grid Array (BGA) device. Another embodiment of the present invention implements the socket with respect to a Land Grid Array (LGA) device. With an LGA device, as compared to a BGA device, rather than there being solder balls on the underside of the device, there are pads, usually of bare gold-plated copper, that contact pins on a printed circuit board. One of ordinary skill in the art will understand, without undue experimentation, how the teachings of the present invention can be implemented with respect to an LGA device.

It should be understood that the BGA device 10 positioned on the socket 502 that is subsequently placed on the pads 108 of the PCB 106 can either be kept in position by soldering the socket 502 to the PCB 106 and holding the BGA device 10 in place by operation of a clamp or clamshell device; or soldering the BGA device 10 to the socket 502 that is also in turn soldered to the pads 108 of the PCB 106. One of ordinary skill in the art will understand, without undue experimentation, that there are numerous mechanisms for holding the BGA device 10 in place with respect to the socket 502 and the PCB 106. Advantageously, by using a clamshell or mechanical structure to hold the components in place, in the event that modifications are necessary, for example, either to swap out the BGA device 10 or the socket 502 or the discrete device 506 within a well 504, it is easier to perform such modifications if the system is not soldered together.

As discussed above, there may be some pins or outputs on the BGA device 10 that do not require a discrete component and yet must be electrically coupled to a corresponding pad on the PCB. In an alternate embodiment, rather than a dummy or zero Ohm resistor being placed in the well, a conductive fill or paste may be predeposited in the one or more wells where a "direct" connection is necessary. Further, similar to that which has been described above, if necessary, the conductive fill may be removed or pushed out if it becomes necessary that a discrete device is to be positioned in the well.

Embodiments of the present invention have been described as using a single discrete component in each well. A modification of an embodiment of the present invention includes the provisioning of two or more discrete devices in one well. In this instance, the devices would be electrically in series with one another and sized to be able to fit the well. One of ordinary skill in the art will understand that the height of a socket can be increased to accommodate multiple devices, more complex two-terminal circuits, or devices of different lengths and it would be within the capacity of one of ordinary skill in the art to provide electrical connections thereto as between the device and the PCB.

Advantageously, because many BGA or LGA devices require a large number of capacitors and/or resistors, implementing the socket according to one or more embodiments of the present invention allows valuable space on the PCB to be freed up to provide space for circuit trace routing. The PCB designer no longer has to add extra vias to a PCB in order to connect traces to the terminating capacitors or resistors as is necessary in the prior art. Reducing the number of vias decreases the cost for manufacturing the printed circuit board and, as above, provides more room for signal traces which can lead to better performance of the printed circuit board. Further, by providing the discrete devices in a socket, the socket and its installed devices becomes a field replaceable unit that is easily swapped out if changes need to be made.

The discrete device inserted into the well of the socket, as above, can be a resistor, a capacitor, an inductor, a diode or a two-terminal circuit, i.e., a two-terminal device as has been described. It should be understood, however, that embodiments of the present invention are not limited to only two-terminal devices nor to only passive devices. In one non-limiting example, a battery of appropriate size could be positioned in a well. Further, a fuse may also be implemented in one or more wells of the socket. Additionally, the dielectric collar described above can be provided with any of the discrete devices in order to provide a blocking function to prevent solder from shorting out the device.

Existing sockets available from known vendors may be modified in accordance with the teachings herein. The LGA775 socket commercially available from Tyco Electronics, Kawasaki, Japan, for example, may be modified to accommodate discrete devices as described herein.

The teachings of the embodiments of the present invention as described herein can be implemented in devices other than a socket configured to receive a BGA or LGA device or mounted as a BGA or LGA device on a PCB. As one example, the socket, while interfacing with a BGA device, may be mounted on the PCB via a mechanism other than a BGA or LGA construction, for example, through-hole or other mechanisms of mounting as known to those of ordinary skill in the art.

In another embodiment of the present invention, a backplane socket that is mounted on a backplane PCB incorporates the wells of the present invention. Advantageously, discrete components positioned in the wells of the backplane socket, for example, terminating resistors, can be used in place of terminating resistors mounted on the backplane PCB itself. By placing the discrete components, in accordance with the teachings herein, the terminating resistors can be placed closer to the interface between the backplane connector and the PCB inserted in the backplane connector thereby providing better performance characteristics and the advantages described above.

In the present specification, the interconnect device has been described as a socket having wells which receive discrete devices. It is expressly noted that the present teachings may also be applied to interconnect devices in the form of "connectors," "receptacles," "plugs," or the like.

Figure 18:
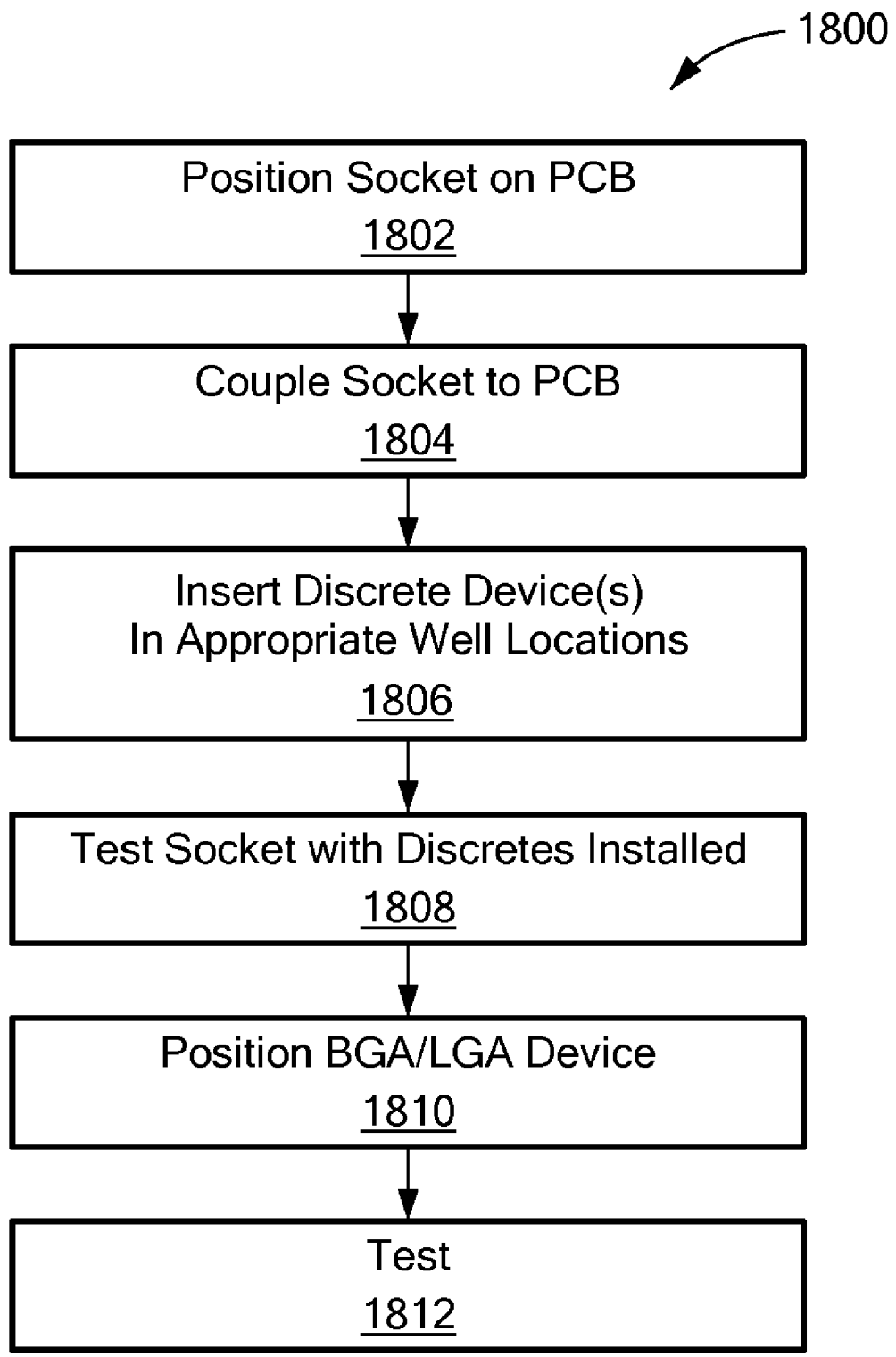
FIG. 18 is a method in accordance with one embodiment of the present invention.

Referring now to FIG. 18, a method 1800 in accordance with one embodiment of the present invention includes positioning the socket on the PCB (step 1802). Next, the socket itself is connected to the PCB (step 1804). It should be noted that the socket could be soldered to the PCB or removeably installed, i.e., held in place by a clamp or clamshell mechanism. At step 1806, discrete devices are provided in appropriate well locations. In one embodiment, an auto insertion machine may be used to position the devices. An auto insertion machine is preprogrammed to identify a particular component for insertion in a particular location, in this case, a well of the socket. Thus, where appropriate, a capacitor, a resistor, a diode, or an inductor, or other device, is provided in an appropriate well as determined by the necessities of a BGA device to which the socket will interface. Where necessary, a zero Ohm or dummy resistor will be provided. Alternatively, the conductive paste as described above could be injected into an appropriate well or wells.

As a part of the assembly process, the socket, with its discrete devices installed, would be tested by operation of, for example, a functional test bed or set of instruments (step 1808). If there are any defects or test failures, the socket and/or failing devices will be replaced or repaired and the configuration retested until it passes. Advantageously, a discrete device may be removed if it has failed a test or the value needs to be changed. Once the configuration passes, the BGA device, or LGA device, is positioned over the socket (step 1810). As above, the BGA device may be soldered or mechanically held in place such that it can be removed later if necessary. Finally, the entire assembly, i.e., the BGA device coupled to the socket, and coupled to the PCB, is tested as defined by the protocol for the manufacturing processes, step 1812.

Having thus described several features of at least one embodiment of the present invention, it is to be appreciated that various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. An interconnect device comprising:
 a body having a first surface and a second surface opposite and substantially parallel to the first surface;
 a well defined within the body and oriented substantially perpendicular to the first and second surfaces, the well having a first opening at the first surface and a second opening at the second surface;
 a two-terminal discrete component inserted within the well, the two-terminal discrete component including first and second conductive ends and first and second terminals affixed, respectively, to the first and second conductive ends;
 a first surface pad positioned on the first surface and coupled to the first terminal of the discrete component; and
 a second surface pad positioned on the second surface and coupled to the second terminal of the discrete component,
 wherein the two-terminal discrete component is configured to electrically couple a first conductive contact to a second conductive contact.

2. The interconnect device of claim 1, wherein the first and second surface pads are soldered, respectively, to the first and second terminals of the discrete component.

3. The interconnect device of claim 2, wherein at least one of the first and second surface pads is configured to interface with a corresponding solder ball of one of: a Ball Grid Array (BGA) device and a printed circuit board.

4. The interconnect device of claim 1, wherein the discrete component comprises one of:
 a resistor;
 a capacitor;
 a diode;
 an inductor;
 a fuse;
 a battery;
 a conductive polymer; and
 a conductive spring.

5. The interconnect device of claim 1, wherein at least one of the first and second discrete component terminals includes at least one of:
 a conductive metal;
 a conductive spring;
 a pliable material; and
 a conductive polymer.

6. The interconnect device of claim 1, wherein at least one of the first and second discrete component terminals is affixed to a body portion of the discrete component by operation of a spring mechanism.

7. The interconnect device of claim 1, wherein at least one of the first and second surface pads is configured to couple to at least one of a Ball Grid Array (BGA) device and a printed circuit board.

8. The interconnect device of claim 1, wherein the discrete component further comprises:
 a body portion having first and second ends affixed, respectively, to the first and second discrete component terminals.

9. The interconnect device of claim 8, further comprising:
 a collar formed of non-conductive material and disposed about the body portion, the collar being configured to hold the discrete component within the well.

10. The interconnect device of claim 9, wherein the body portion comprises one of:
 a resistor;
 a capacitor;
 a diode;
 an inductor;
 a conductive spring;
 a battery; and
 a fuse.

11. The interconnect device of claim 8, wherein the body portion, first terminal and second terminal are contained in a unitary structure.

12. The interconnect device of claim 1, wherein the discrete component comprises one of:
 a press-fit component;
 a spring loaded discrete component (SLDC); and
 a conductive end cap component (CECC).

13. The interconnect device of claim 12, wherein the press-fit component comprises:
 a body portion; and
 a collar formed of non-conductive material and disposed about the body portion, the collar being configured to hold the body portion within the well.

14. The interconnect device of claim 12, wherein the spring-loaded discrete component (SLDC) comprises:
 a spring mechanism affixing at least one of the first and second terminals to a body portion of the SLDC.

15. The interconnect device of claim 12, wherein the conductive end-cap component (CECC) comprises:
 a body portion having first and second ends affixed, respectively, to the first and second terminals,
 wherein at least one of the first and second terminals comprises a pliable conductive material.

16. The interconnect device of claim 1, wherein:
the two-terminal discrete device is hermetically sealed within the well.

17. The interconnect device of claim 16, wherein at least one of:
the first surface pad is a solderable pad; and
the second surface pad is a solderable pad.

18. The interconnect device of claim 17, wherein at least one of the first and second solderable pads is configured to be coupled to one of a respective solder ball of a Ball Grid Array (BGA) device and a respective solder pad of a printed circuit board.

19. A spring-loaded component, comprising:
a body portion comprising at least one electrical component, the body portion having a longitudinal length and first and second ends;
a first conductive terminal having a recess at a first end thereof;
a second conductive terminal having a recess at a first end thereof;
a first conductive coil spring having first and second ends, the first end of the first spring affixed to the first end of the body portion and the second end of the first spring affixed within the recess of the first terminal; and
a second conductive coil spring having first and second ends, the first end of the second spring affixed to the second end of the body portion and the second end of the second spring affixed within the recess of the second terminal,
wherein each of the first and second springs is oriented in-line with the longitudinal length of the body portion.

20. The spring-loaded component of claim 19, wherein at least one of the first and second terminals includes solderable material.

21. The spring-loaded component of claim 19, wherein the body portion comprises one of:
a resistor;
a capacitor;
a diode;
an inductor;
a battery; and
a fuse.

22. A discrete component, comprising:
a body portion having a longitudinal length and first and second ends; and
first and second terminals affixed, respectively, to the first and second ends of the body portion, wherein each of the first and second terminals comprises a conductive and pliable material, and
wherein the body portion includes one of:
a resistor;
an inductor;
a capacitor;
a diode;
a battery; and
a fuse,
wherein the discrete component is configured for insertion in a well of an interconnect device.

23. The discrete component of claim 22, wherein the second terminal comprises a conductive and pliable material.

24. The discrete component of claim 22, wherein:
at least one of the first and second terminals is affixed to the body portion by at least one of a conductive glue and a conductive epoxy.

25. The discrete component of claim 22, wherein:
at least one of the first and second terminals is mechanically attached to the body portion.

* * * * *